US009455151B2

(12) United States Patent
Bauer et al.

(10) Patent No.: US 9,455,151 B2
(45) Date of Patent: Sep. 27, 2016

(54) INTEGRATED CAPACITOR AND METHOD FOR PRODUCING THE SAME

(71) Applicant: Fraunhofer-Gesellschaft zur Foerderung der angewandten Forschung e.V., Munich (DE)

(72) Inventors: Anton Bauer, Beratzhausen (DE); Tobias Erlbacher, Poxdorf (DE); Holger Schwarzmann, Hoechstadt (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/549,791

(22) Filed: Nov. 21, 2014

(65) Prior Publication Data
US 2015/0145104 A1 May 28, 2015

(30) Foreign Application Priority Data

Nov. 22, 2013 (DE) .................. 10 2013 019 912
Jan. 17, 2014 (DE) .................. 10 2014 200 869

(51) Int. Cl.
*H01L 21/02* (2006.01)
*H01L 21/283* (2006.01)
*H01L 29/66* (2006.01)
(Continued)

(52) U.S. Cl.
CPC ......... *H01L 21/283* (2013.01); *H01L 27/0682* (2013.01); *H01L 27/0694* (2013.01); *H01L 27/0805* (2013.01); *H01L 29/66181* (2013.01); *H01L 29/945* (2013.01)

(58) Field of Classification Search
CPC ............. H01L 21/283; H01L 27/0682; H01L 27/0694; H01L 27/0805; H01L 29/66181; H01L 29/945
USPC .......... 257/435, 532, 649, 34; 438/381, 122, 438/614; 361/91.5
See application file for complete search history.

(56) References Cited

U.S. PATENT DOCUMENTS 5,780,335 A * 7/1998 Henkels ................ H01L 27/108
257/E27.084
7,202,557 B2 4/2007 Oliver et al.
(Continued)

FOREIGN PATENT DOCUMENTS

JP 2003-45739 A 2/2003
JP 2007-95950 A 4/2007
(Continued)

OTHER PUBLICATIONS vom Dorp, J. et. al., "Dielectric Layers Suitable for High Voltage Integrated Trench Capacitors", Journal of Vacuum Science Technoloy B, vol. 29, No. 1, Jan./Feb. 2011, 6 pages.
(Continued)

*Primary Examiner* — Mohammed Shamsuzzaman
(74) *Attorney, Agent, or Firm* — Keating & Bennett, LLP

(57) ABSTRACT

An integrated capacitor includes a substrate with a first main surface area and an opposing second main surface area. A capacitor structure with a dielectric layer is integrated in the first main surface area. A compensation structure with a compensation layer is integrated in the second main surface area. The ratio between a surface enlargement of the second main surface area effected by the compensation structure corresponds to at least 30% of the surface enlargement of the first main surface area effected by the capacitor structure.

27 Claims, 8 Drawing Sheets

(51) Int. Cl.
*H01L 27/06* (2006.01)
*H01L 27/08* (2006.01)
*H01L 29/94* (2006.01)

(56) References Cited

U.S. PATENT DOCUMENTS

| | | | |
|---|---|---|---|
| 7,738,226 B2 | 6/2010 | Berberich et al. | |
| 2002/0130388 A1* | 9/2002 | Stamper | H01L 28/40 257/532 |
| 2008/0310065 A1* | 12/2008 | Ho | H01L 23/552 361/91.5 |
| 2009/0108403 A1* | 4/2009 | Gogoi | H01L 28/91 257/532 |
| 2009/0242977 A1* | 10/2009 | Kawaguchi | H01L 29/42368 257/330 |
| 2010/0001217 A1 | 1/2010 | Jee et al. | |
| 2010/0109131 A1* | 5/2010 | Lehr | H01L 21/2855 257/649 |
| 2010/0181645 A1* | 7/2010 | Marenco | H01L 27/0694 257/532 |
| 2014/0225231 A1* | 8/2014 | Gambino | H01L 23/562 257/629 |
| 2014/0374879 A1* | 12/2014 | Chen | H01L 28/60 257/532 |

FOREIGN PATENT DOCUMENTS

| | | |
|---|---|---|
| JP | 2009-260271 A | 11/2009 |
| JP | 2011-77187 A | 4/2011 |
| JP | 2012-186479 A | 9/2012 |

OTHER PUBLICATIONS

Erlbacher, T. et. al., "Improving Module Performance and Reliability in Power Electronic Applications by Monolithic Integration of RC-snubbers", Proceedings of the 24th International Symposium on Power Semiconductor Devices and ICs, Jun. 3-7, 2012, pp. 283-286.

Hakim, H. et al., "Nonlinear Capacitors Integration", Proceedings of the International Semiconductor Conference, vol. 1, 2000, pp. 303-306.

Rehak, P. et al., "Progress in Semiconductor Drift Detectors", Nuclear Instruments and Methods in Physics Research A 248, 1986, pp. 367-378.

vom Dorp, J. et. al., "Integrierbare Bauelemente zur Erhöhung der Betriebssicherheit Elektronischer Systemkomponenten im Automobil", Automotive meets Electronics, 2010, pp. 72-77.

\* cited by examiner

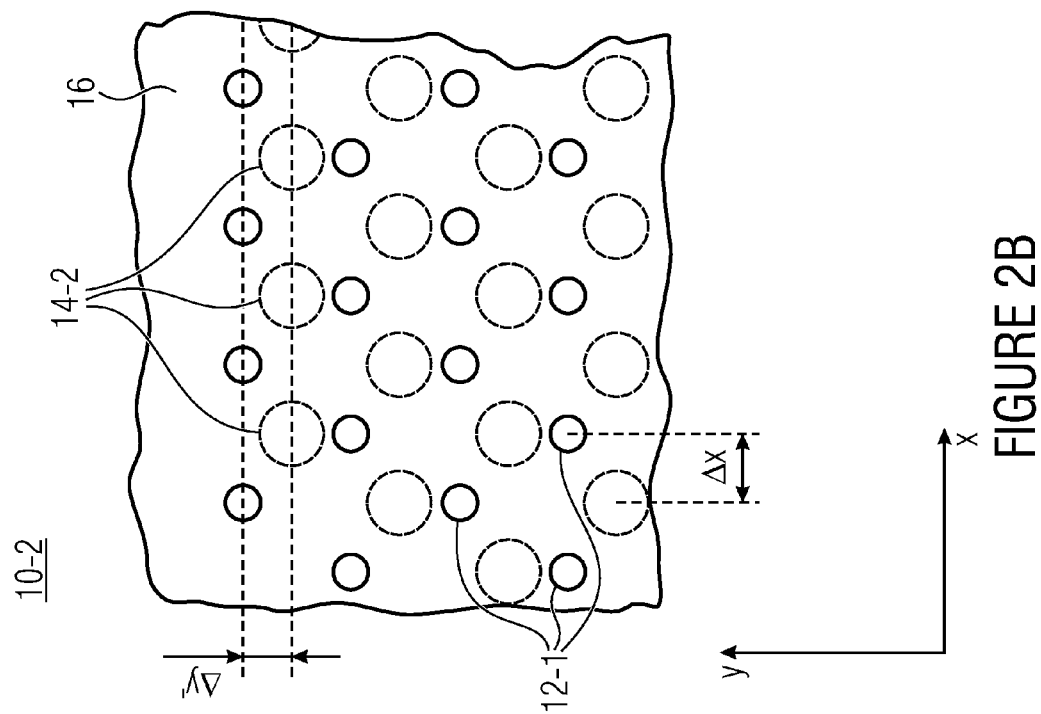
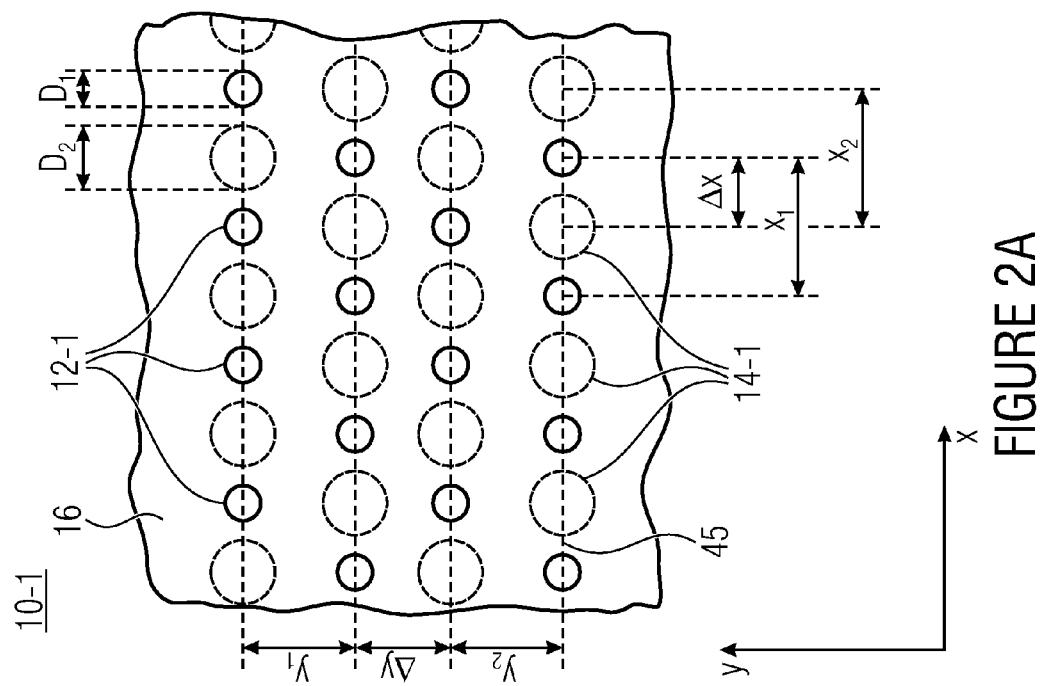

INTEGRATED CAPACITOR AND METHOD FOR PRODUCING THE SAME

CROSS-REFERENCE TO RELATED APPLICATIONS

This application claims priority from German Patent Application No. 102013019912.3, which was filed on Nov. 22, 2013, and is incorporated herein in its entirety by reference.

BACKGROUND OF THE INVENTION

The present invention relates to an integrated electric capacitor having a capacitor structure and a compensation structure and a method for producing the same. In particular, the present invention relates to trench capacitors structured on both sides for power-electronic applications.

During manufacturing processes of integrated circuits, mechanical tensions can occur in the semiconductor material, which can interfere or affect the production process itself (for example, due to bending of the wafer) or can also affect the electric characteristics of the integrated circuit in a spurious manner. Frequently, there is a connection, for example between the structures and thicknesses of deposited insulating layers (e.g. dielectrics) and the resulting mechanical tensions in the semiconductor material of the substrate (wafer).

This problem occurs in particular in integrated structured trench capacitors for power-electronic applications, whereby also the resulting operating voltage of such integrated capacitors for high-voltage applications is limited, or the obtainable layer thickness and/or the uniformity of the deposited dielectric are the limiting quantities for obtainable high-voltage operating ranges.

For increasing integration densities of electric circuits, enlargement of the capacitor surface, for example by hole or trench structures, is indispensable.

Mechanical tensions in monolithically integrated 3D capacitors with trench or hole structures for high operating voltages in the range of 600 V and above may be too high after the production or deposition of dielectric layers, i.e. so high that mechanical damages of the dielectric layers occur. Depositing the dielectric layer, for example an oxide, is performed partly at temperatures of beyond 1000° C. After thermal oxidation and during cooling of the substrate, for example a semiconductor substrate such as silicon, thermal tension occurs due to different coefficients of thermal extension between substrate and deposited and dielectric layer, e.g. between silicon and silicon dioxide. Silicon dioxide ($SiO_2$) has, for example, a coefficient of thermal expansion of approximately $5.6 \times 10^{-7}$ $K^{-1}$, while silicon has a coefficient of thermal expansion of approximately $2.6 \times 10^{-6}$ $K^{-1}$. Thus, during cooling, a silicon substrate reduces its volume to a greater extent than a silicon oxide layer disposed thereon, which forms the dielectric layer. This can result in material tensions and deformations (tiltings) in the substrate and/or the dielectric layer.

Alternatively or additionally, an intrinsic mismatch between silicon dioxide layer and substrate due to different grid structures and volume expansions can result in further material tensions. A resulting bending of the substrates, for example semiconductor substrates, can again have the effect that the same cannot be processed further or that the insulating layers "break up" and lose their insulating effect. In such a case, the breakdown voltage of the capacitor (where a resistance drop in the capacitor occurs and results in a voltage drop—short circuit—in the capacitor) can fall below the operating voltage. With increasing thickness of the dielectric layers for increasing operating voltages, the mechanical tensions increase simultaneously. Deformations in a silicon wafer can, for example, have the effect that the wafer can no longer be received by an uptake and/or a chuck, for example a vacuum chuck for fixation in the production line and can hence not be processed further, for example since the deformation prevents a tightness for generating the vacuum. Alternatively or additionally, based on the bending, photolithography designed for planar surfaces (for example irradiation of a top or a bottom of the wafer) may be prevented, since bent wafers are not exposed correctly.

Thus, so far, no monolithic capacitors with operating voltages of more than 600 V can be realized in a manner suitable for mass production. Even in monolithic capacitors for operating voltages around 600 V, difficulties occur again and again during further processing with semiconductor technology processes due to the mechanical stress after deposition of the dielectrics. Thus, so far mostly ceramic or film capacitors are used for these operating voltages.

Monolithically integrated trench capacitors and RC snubbers (resistor (R)-capacitor (C)), i.e. 3D damping devices having a structure as shown in FIG. 8 comprise a structured front of the slice and a rear of the slice without structures having mechanical functions. In this regard, reference is made, for example, to U.S. Pat. No. 7,738,226.

Semiconductor technology and reliability of capacitors and RC devices in a voltage range between 200 V and 600 V has been described in detail in the literature, cf. [1, 2, 3].

Beyond that, capacitors have already been produced by monolithic integration for different applications and operating voltages, as described in [4].

Integrated capacitors that are suitable for mass production useable in integrated circuits and high-voltage applications and that can be operated with higher operating voltages, for example more than 600 V, more than 800 V or more than 1,000 V would be desirable, such that an array of ceramic or film capacitors can be omitted in circuits and integrated devices, and the respective circuits can be implemented in a more compact manner, i.e. with higher integration density.

SUMMARY

According to an embodiment, an integrated capacitor may have: a substrate with a first main surface area and an opposing second main surface area; a capacitor structure with a dielectric layer, wherein the capacitor structure is integrated in the first main surface area; and a compensation structure with a compensation layer that is integrated in the second main surface area; wherein a ratio between a surface enlargement of the second main surface area effected by the compensation structure with regard to a theoretical surface of the substrate in the second main surface area when the compensation structure is absent, corresponds to at least 30% of the surface enlargement of the first main surface area effected by the capacitor structure with regard to a theoretical surface of the substrate in the first main surface area when the capacitor structure is absent; wherein structures of the compensation structure are arranged laterally offset with respect to structures of the capacitor structure.

According to another embodiment, an integrated capacitor may have: a substrate with a first main surface area and an opposing second main surface area; a capacitor structure with a dielectric layer, wherein the capacitor structure is integrated in the first main surface area; and a compensation structure with a compensation layer, wherein the compensation structure is integrated in the second main surface area; wherein the compensation structure is implemented to at least partly compensate, based on a material tension between the compensation layer and the substrate, material tension between the dielectric layer and the substrate in the substrate, such that a deformation of the substrate induced by the material tension between the dielectric layer and the substrate is reduced; wherein structures of the compensation structure are arranged laterally offset with respect to structures of the capacitor structure.

Another embodiment may have the usage of the inventive capacitor in a power module or in a packaged semiconductor device.

According to another embodiment, a method for producing an integrated capacitor may have the steps of: providing a substrate with a first main surface area and an opposing second main surface area; forming a capacitor structure with a dielectric layer in the first main surface area; and forming a compensation structure with a compensation layer in the second main surface area, such that structures of the compensation structure are arranged laterally offset with regard to structures of the capacitor structure; wherein a ratio between a surface enlargement of the second main surface area effected by the compensation structure with regard to a theoretical surface of the substrate in the second main surface area when the compensation structure is absent, corresponds to at least 30% of the surface enlargement of the first main surface area effected by the capacitor structure with regard to a theoretical surface of the substrate in the first main surface area when the capacitor structure is absent; or wherein the compensation structure is implemented to at least partly compensate, based on a material tension between the compensation layer and the substrate, material tension between the dielectric layer and the substrate in the substrate, such that a deformation of the substrate induced by the mechanical tension between the dielectric layer and the substrate is reduced.

It is the core idea of the present invention that effects of production-related mechanical tensions, for example a deformation of the substrate, can be compensated by a compensation structure with a compensation layer on a main surface area, which is arranged opposite to a main surface area where a capacitor structure is integrated with a dielectric layer, such that the deformation of the substrate is reduced and the dielectric layer can thus be implemented in a thicker and/or more uniform manner than before, without showing any mechanical damages during cooling. The thicker dielectric layers allow a higher operating voltage of such an integrated capacitor.

Embodiments of the present invention provide an integrated capacitor with a substrate having a first main surface area, for example a wafer top or bottom, and an opposing or opposed second main surface area, for example the wafer bottom or top. A capacitor structure, for example a hole or trench structure with a dielectric layer is integrated in the first main surface area. A compensation structure with a compensation layer is integrated in the second main surface area. The capacitor structure and the compensation structure are implemented to each effect a surface enlargement of the first or second main surface area. The surface enlargement of the compensation structure is at least 30% of the surface enlargement effected by the capacitor structure. A hole structure can be referred to as cavity (depression) or recess open on one side.

It is an advantage of this embodiment that, by the surface enlargement of the compensation layer, mechanical tensions can be induced into the substrate in the compensation structure, which counteract the mechanical tensions induced by the dielectric layer in the capacitor structure into the substrate with respect to material deformation, such that deformation of the substrate is reduced and the dielectric layer shows less or no damages and/or can be implemented with greater layer thickness, such that higher operating voltage is enabled.

Further embodiments provide an integrated capacitor where a first electrode terminal is arranged at the capacitor structure and a second electrode terminal at the substrate, and wherein further a third electrode terminal is arranged at the compensation structure. The compensation structure comprises a compensation material isolated from the substrate by the compensation layer.

It is an advantage of this embodiment that the compensation structure itself can be used as further capacitance in an electric circuit. This allows the usage of the integrated capacitor as two capacitances connected in series with a center tap in the form of a second electrode terminal. Tapping an electrical voltage can take place on both main surface areas and/or the center tap.

Further embodiments provide integrated capacitors wherein the compensation structure comprises a hole structure, a trench structure, a column structure or a ring structure or a combination of at least two of these elements.

It is an advantage of these embodiments that the compensation structure can be adapted to the capacitor structure in order to influence a ratio of the surface enlargements of the first main surface area and the second main surface area as well as a mechanical stability of the substrate in order to further reduce deformation of the material.

Alternative embodiments provide an integrated capacitor where the compensation structure is implemented geometrically or topographically, for example with respect to a width of the trenches, a diameter of the holes or a depth of the compensation structure, in the same way as the capacitor structure within a tolerance range and is arranged opposite the capacitor structure such that a neutral fiber or center line of the substrate forms a line of symmetry, wherein the capacitor structure and the compensation structure are arranged symmetrically with respect to the line of symmetry. In other words, the compensation structure can be a projection of the capacitor structure in the second main surface area and can be shifted, for example, in the lateral direction. The tolerance range can include a distance of the shift. Alternatively or additionally, the tolerance range can comprise a differing depth of compensation and capacitor structures or can be influenced by a tolerance of the production process.

A symmetrical array of compensation and capacitor structures can result in an increased compensation of deformations in the substrate.

Further embodiments relate to a usage of an integrated capacitor in a power module, such as a damping element.

It is an advantage of this embodiment that such a usage allows reduction of the structural sizes of the power module and/or an increase of the operating voltage.

BRIEF DESCRIPTION OF THE DRAWINGS

Embodiments of the present invention will be detailed subsequently referring to the appended drawings, in which:

FIG. 2a is a schematic top view of a section of a first main surface area of an integrated capacitor as described in FIG. 1, according to an embodiment of the present invention;

FIG. 2b is a schematic top view of a section of an integrated capacitor according to FIG. 2a, wherein the holes of a compensation structure are shifted in a distance in a y-direction with respect to the holes of the capacitor structure of FIG. 2a, according to an embodiment of the present invention;

DETAILED DESCRIPTION OF THE INVENTION

Before embodiments of the present invention will be discussed in detail below with reference to the drawings, it should be noted that identical, functionally equal or equal elements, objects and/or structures in the different figures are provided with the same reference numbers, so that the description of these elements illustrated in different embodiments is interchangeable or can be applied to each other.

Figure 1:
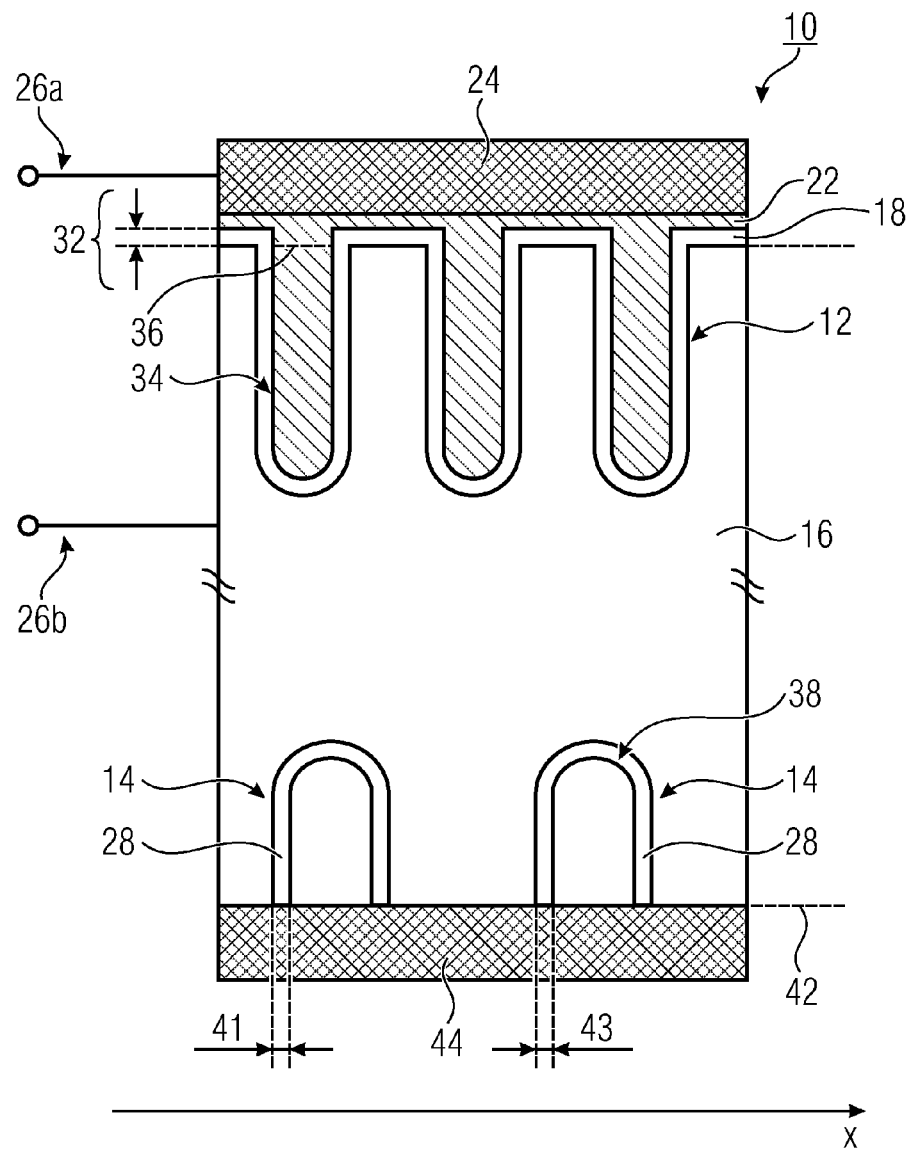
FIG. 1 is a section of a schematic sectional view of an integrated capacitor with a capacitor structure and a compensation structure according to an embodiment of the present invention.

FIG. 1 shows a section of a schematic side view of an integrated capacitor 10 with a capacitor structure 12 and a compensation structure 14. The section can, for example, be part of a substrate from which a plurality of integrated capacitors 10 are formed. The capacitor structure 12 is integrated in a first main surface area of a substrate 16. The substrate 16 is, for example, a semiconductor material or a semiconductor substrate, such as based on silicon or of silicon, and can be implemented as a wafer from which the plurality of capacitors are formed. The substrate can be monolithic, i.e. integral and/or single-crystalline with respect to one or several integrated capacitors.

The compensation structure 14 is integrated in a second main surface area which is of the substrate 16 which is arranged opposite to the first main surface area. If the substrate 16 is, for example a wafer having a top, a bottom and a side area as a connection between the top and bottom, the first main surface area can be the top or bottom of the wafer and the second main surface area can be the remaining of the two sides of the wafer.

The capacitor structure 12 comprises a dielectric layer 18 arranged at the substrate 16. The dielectric layer 18 can comprise, for example, silicon oxide ($SiO_2$), silicon nitride ($Si_3N_4$) or another electrically insulating material and/or can be formed of the same.

Further, the integrated capacitor 10 includes an electrode material 22 introduced into the capacitor structure 12. The electrode material 22 is electrically conductive in order to form a first capacitor electrode. An electrically conductive layer 24, for example aluminum, copper or gold is arranged at the electrode material 22. A first electrode terminal 26a is arranged at the electrically conductive layer. The first electrode terminal 26a can, for example, be implemented as a bond, solder or clamp contact and is implemented to be provided with electric voltage. Alternatively, the first electrode terminal 26a can also be connected to the electrode material. In simple terms, the electrically conductive layer 24 (front metallization) is arranged at the electrode material 22 (front electrode) and the same at the dielectric layer 18 (dielectric), wherein the electrically conductive layer 44 (rear metallization) partly contacts the substrate 16. A voltage difference between substrate 16 and electrode material 22 results in an influence of electric charges and the formation of an electric capacitor. An increased layer thickness 32 results in reduced capacitance and increased breakdown voltage of the capacitor, an increased capacitor surface to an increased capacitance of the electric capacitor.

The substrate 16 comprises a second electrode terminal 26b. The second electrode terminal 26b can, for example, be implemented as bond, solder or clamp contact and is implemented to be provided with an electric voltage and to transmit this electric voltage to the substrate. Applying electric voltage between the first electrode terminal 26a and the second electrode terminal 26b results in the formation of an electric capacitor between the electrically conductive layer 24 or the electrode material and the substrate 16, analogously to a plate capacitor whose surface is enlarged by the capacitor structure 12 with respect to a planar implementation, i.e. with respect to the absence of the/a planar capacitor structure 12. The dielectric layer 18 is implemented to isolate the electrode material 22 from the substrate 16, i.e. to electrically insulate the same. The electrically conductive layer 24 can completely or partly comprise the same material as the electrode material 22. The electrode material 22 and the electrically conductive layer 24 can be formed integrally.

The compensation structure 14 includes a compensation material 28. The compensation material 28 can be any material. When the dielectric layer 18 has a lower coefficient of thermal expansion than the substrate 16, the compensation material 28 can have a lower coefficient of thermal expansion than the substrate 16. Alternatively, the compensation material can have a higher coefficient of thermal expansion than the substrate 16 when the dielectric layer 18 has a higher coefficient of thermal expansion than the substrate 16. For example, the compensation material 28 can be an oxide or a nitride based on silicon or another material, for example deposited by evaporation, which behaves similarly to the dielectric layer 18 during cooling of the dielectric layer 18 and the substrate 16 regarding thermal expansion with respect to the substrate 16.

During cooling, mechanical tensions (stresses) are induced in the substrate 16, among others due to the thermal expansion and/or a grid offset between the dielectric layer 18 and the substrate 16. At the same time, voltages based on the same effects are induced between the compensation layer 28 and the substrate 16.

Deformations, for example bending of the substrate 16 caused by material tensions between the dielectric layer 18 and the substrate 16 are reduced by deformations or material tensions between the compensation layer 28 and the substrate 16. Put in simpler terms, two opposite (or counteracting) deformation forces are induced into the substrate 16, such that overall deformation is reduced. Thereby, a thickness 32 of the dielectric layer 18 can be enlarged since, for example, the dielectric layer 18 experiences less deformation, such that damage of the dielectric layer is reduced or prevented or a thickness 32, which is enlarged with respect to currently available integrated capacitors, can be deposited until an allowable deformation or allowable material stress of the substrate 16 or the dielectric layer 18 is obtained. An enlarged thickness 32 can result in an increased breakdown voltage of the dielectric layer 18 and hence an increased operating voltage of the integrated capacitor 10 which can be applied between the first electric terminal 26a and the second electric terminal 26b.

The surface enlargement of the first main surface area can be described by a ratio of the substrate surface as determined by the substrate surface 34 to a theoretical substrate surface which would result in the absence of the capacitance structure 12 and which is indicated by the dotted line as limiting surface 36. The surface enlargement in the first main surface area results in an increase of the capacitance of the integrated capacitor 10. The arrangement of the dielectric layer 18 at the enlarged substrate surface in the first main surface area, i.e. the enlarged surface covered by the dielectric layer 18, results in an increase of the mechanical tensions introduced into the substrate 16 by the capacitor structure 12.

The compensation structure 14 effects a surface enlargement in the second main surface area which can be described by a ratio of the substrate surface in the second main surface area defined by the substrate surface 38 to a theoretical surface of the substrate 16 in the second main surface area in the absence of the compensation structure as indicated by the dotted line as limiting surface 42. This means that the surface enlargement of the first main surface area relates to an area of the capacitor structure covered by the dielectric layer and that further the surface enlargement of the second main surface area relates to an area of the compensation structure covered by the compensation layer. The respective area limitation is the area covered by the dielectric layer or the compensation layer.

The surface enlargement of the second main surface area is at least 30% of the surface enlargement in the first main surface area. The surface enlargement of the second main surface area can also be greater and can depend, for example, on an intended layer thickness 32 of the dielectric layer 18. Put more simply, for a desired higher layer thickness 32 of the dielectric layer 18, a greater surface enlargement of the second main surface area can be used for reducing or compensating occurring deformations. The compensation layer 28 can comprise different thicknesses in sections. For example, a layer thickness 41 of a first section of the compensation layer is not the same as the layer thickness 43 of a second section. Layer thicknesses 41 and 43 can also be the same. Alternatively or additionally, layer thicknesses 32, 41 and/or 43 can be the same or different.

The dielectric layer 18 and the compensation layer 28 can be formed of the same material or can include the same materials. For example, when processing the wafer with the substrate 16, the structures of the capacitor structure 12 and the compensation structure 14 can be formed, for example by an etching process, the dielectric layer 18 and the compensation layer 28 can be deposited simultaneously, for example during one process step by means of vaporization. Alternatively, the dielectric layer 18 and/or the compensation layer 28 can also be deposited by methods for coating by means of thermal oxidation, or, for example, by chemical vapor deposition (CVD). Coating by means of thermal oxidation or CVD allows homogenous, i.e. uniform layer thicknesses. The dielectric layer 18 and the compensation layer 28 can further comprise the same layer thickness. Alternatively, the layer thicknesses of the dielectric layer 18 and the compensation layer 28 can be different.

Further, the integrated capacitor 10 comprises an optional, electrically conductive layer 44. The electrically conductive layer 44 can be arranged at the substrate 16, for example, in the same processing step where the electrically conductive layer 24 is also arranged, for example in a vaporization process. The integrated capacitor 10 can have a lateral extension with a plurality of depressions and/or elevations by the capacitor structure 12 and/or the compensation structure 14 along an x-direction which can run in parallel to the first and/or second main surface area and/or can comprise different directions as indicated by the parallel lines at the lateral edges of the substrate.

In that way, layer thicknesses 32 of the dielectric layer 18 of more than 500 nm can be realized, for example when the dielectric layer 18 is completely or partly formed of silicon nitride.

A layer thickness of 500 nm silicon nitride corresponds, for example, to an equivalent oxide thickness (EOT) of approximately 280 nm. The equivalent oxide thickness or equivalent oxide layer thickness indicates a reference magnitude of a dielectric material with respect to silicon dioxide. Silicon dioxide has a relative permittivity $\in_r$ of 3.9. Silicon nitride has relative permittivity $\in_r$ of 7. According to the equation:

$$500 \text{ nm} \cdot \frac{3.9}{7} \approx 280 \text{ nm}$$

it results that silicon nitride with a layer thickness of 500 nm has an equivalent oxide thickness (EOT) of 280 nm. If the dielectric layer 18 is, for example, formed of alumina ($Al_2O_3$) having a relative permittivity $\in_r$ of 9, a layer thickness of 650 nm can result in an equivalent oxide thickness of 280 nm. Alternatively, the dielectric layer can also have a layer thickness of more than 1000 nm or more than 1500 nm.

This means that the material of the dielectric layer can have a higher relative permittivity and can be arranged at a greater thickness, such that a maximum operating voltage before a breakdown voltage breaking the dielectric layer 18 is obtained, is enlarged further. This can be enabled, for example, by so-called high-k dielectrics having a high relative permittivity, such as titanium oxide ($TiO_2$), tantalum oxide ($Ta_2O_5$) or lanthanum oxide ($La_2O_3$).

In other words, the mechanical stress in the substrate 16 can be changed, i.e. reduced or increased, by additional 3D structures on the rear of the slice and their filling with layers having similar stress behavior as on the front, such that deformation of the wafer can be reduced or even compensated during processing. Thereby, thicker dielectric layers 12 can be realized and the capacitors 10 can be operated at higher operating voltages.

Here, the 3D structures can be realized as holes, trenches, rings, V structures, i.e. linearly tapering trenches or holes, for example by means of potassium hydroxide (KOH) etching and can be short-circuited on the rear of the slice. In this context, short-circuited means that the electrically conductive layer 44 is in electrical contact with the substrate 16, i.e. short-circuited, such that a low or neglectable capacitive effect results when applying an electric voltage between the electrically conductive layer 44 and the substrate 16. Put more simply, the compensation structure 14 has no electric function in the sense of a capacitor. Alternatively or additionally, a further electrode terminal can be arranged at the electrically conductive layer or the compensation material. The further electrode terminal can be short-circuited to the second electrode terminal 26b in order to allow potential equalization between the substrate 16 and the electrically conductive layer 44.

FIG. 2a shows a schematic top view of a section of a first main surface area of an integrated capacitor 10-1 as described in FIG. 1. Here, the integrated capacitor 10-1 has enlarged dimensions in the x-direction and y-direction in a drawing plane of FIG. 2a, as indicated by the curved edges. For improved clarity, merely the substrate 16 as well as the capacitor structure 12 and the compensation structure 14 are shown, without the electrically conductive areas (layers), the electrode material, the dielectric layer 18 and the compensation layer 28 illustrated in FIG. 1. The holes of the capacitor structure 12-1 implemented as hole structure are illustrated as continuous circles.

A capacitor structure 12-1 is implemented as a hole structure. The holes of the capacitor structure 12-1 have a diameter $D_1$. A compensation structure 14-1 (covered by the first main surface area and illustrated in a dotted manner) includes a hole structure with holes having a diameter $D_2$. The diameter $D_2$ is greater than the diameter $D_1$. The surface enlargement of the second main surface area effected by the compensation structure 14-1 is hence greater than 100% with respect to the surface enlargement of the first main surface area effected by the capacitor structure 12-1 when the holes of the capacitor structure 12-1 and the compensation structure 14-1 are completely covered by the dielectric layer or the compensation layer. The compensation structure 14-1 and the capacitor structure 12-1 or their respective holes are arranged in x-direction with a distance $x_1$ or $x_2$ and in the y-direction with a distance $y_1$ or $y_2$. The compensation structure 14-1 is offset with respect to the capacitor structure 12-1, such that a hole of the compensation structure 14-1 is arranged between two holes of the capacitor structure 12-1 along a line 45, and a hole of the compensation structure 14-1 has a distance $\Delta x$ to a hole of the capacitor structure 12.

Further, the holes of the capacitor structure 12-1 have a distance of $y_1$ in y-direction and the holes of the compensation structure 14-1 a distance of $y_2$ along the y-direction. The distances $y_1$ and $y_2$ can be identical. A distance between the lines along one column corresponds to a distance $\Delta y$.

In other words, the compensation structure 14-1 is similar to the capacitor structure 12-1, wherein the holes of the compensation structure 14-1 have a greater diameter than the holes of the capacitor structure 12-1. Further, the compensation structure 14-1 is offset with respect to the capacitor structure 12-1 by the distance $\Delta x$ in x-direction.

It is an advantage of the compensation structure 14-1 offset with respect to the capacitor structure 12-1 that a thickness or a material strength of the substrate 16 between the capacitor structure 12-1 and the compensation structure 14-1 can be enlarged in a thickness direction that is arranged perpendicular to the x-direction and perpendicular to the y-direction in space, compared to an opposed arrangement of capacitor structure 12-1 and compensation structure 14-1. This can increase mechanical stability of the integrated capacitor 10-1.

Alternatively, diameters $D_1$ and $D_2$ can have the same value, or diameter $D_1$ can be greater than $D_2$. Alternatively or additionally, the capacitor structure 12-1 and/or the compensation structure 14-1 can also have further or different structural components, such as trench or column structures. The capacitor structure 12-1 and/or the compensation structure 14-1 can be implemented in a non-uniform manner, i.e. the holes of a structure 12-1 or 14-1 can comprise, for example, a non-uniform diameter $D_1$ and/or $D_2$, trenches of a structure 12-1 or 14-1 can, for example, have a non-uniform width and/or depth. Further, the compensation structure 14-1 can be arranged congruently to the capacitor structure 12-1 in the x-direction and/or y-direction.

While the capacitor structure 12-1 and the compensation structure 14-1 are illustrated equally as a hole structure having the same number of holes in FIG. 2a, the capacitor structure 12-1 and the compensation structure 14-1 can have different shapes and/or a different number of respective structural elements.

FIG. 2b shows a schematic top view of a section of an integrated capacitor 10-2 according to FIG. 2a, wherein the holes of a compensation structure 14-2 are offset with respect to the holes of the capacitor structure 12-1 at a distance $\Delta y'$, which is reduced with respect to the distance $\Delta y$ of FIG. 2a. In other words, the holes of the compensation structure 14-2 are offset in x-direction and in y-direction.

Figure 3:
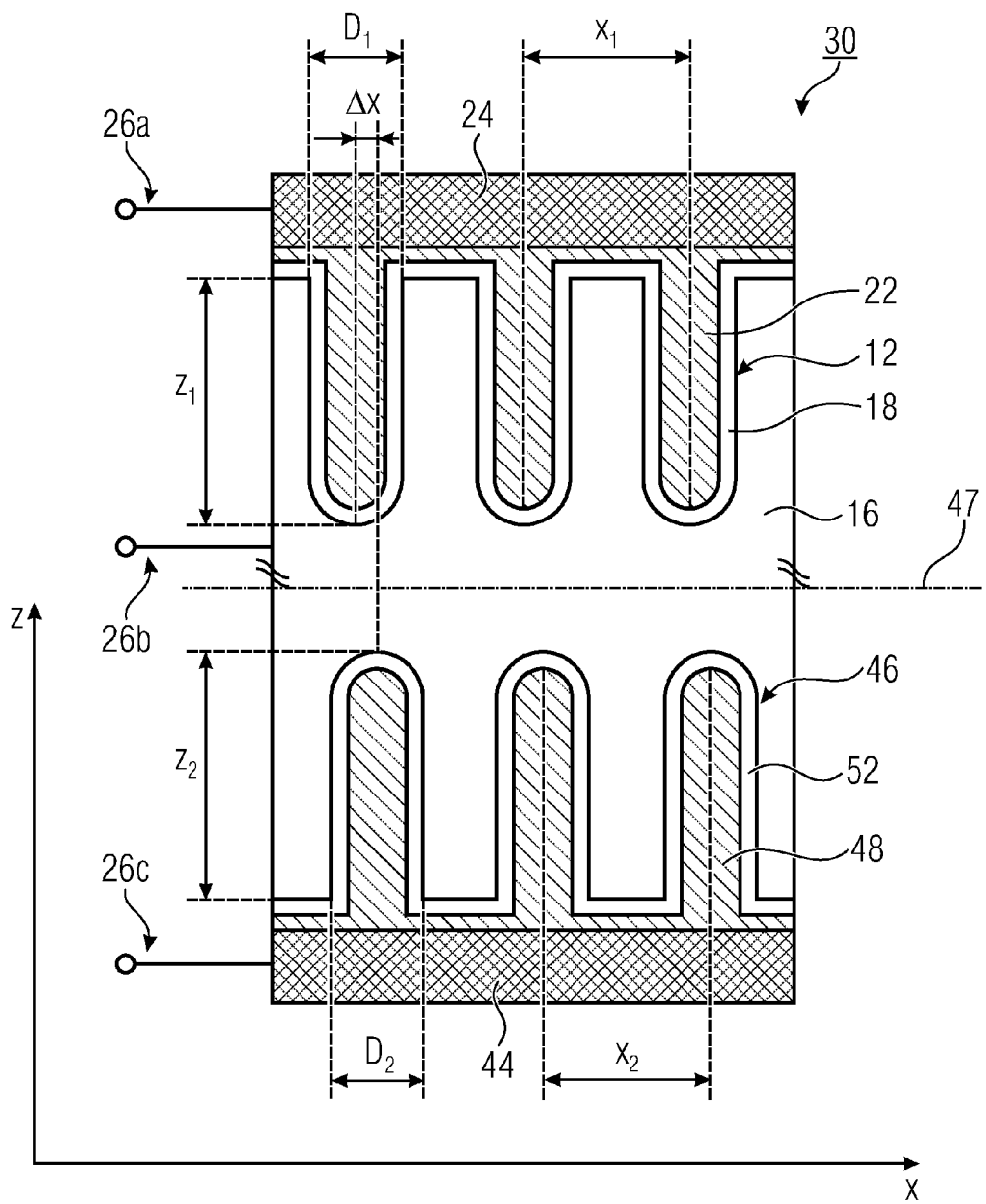
FIG. 3 is a schematic sectional view of a section of an integrated capacitor where the functionality of a capacitor is implemented at a second main surface area, according to an embodiment of the present invention.

FIG. 3 shows a schematic side view of a section of an integrated capacitor 30 where the functionality of a capacitor is implemented on the second main surface area.

The holes of the capacitor structure 12 have the diameter $D_1$ and a depth $z_1$ in a depth direction z and are arranged at distance $x_1$ to each other. A compensation structure 46 comprises a hole structure, whose holes have the diameter $D_2$ and a depth $z_2$ in a depth direction z and the distance $x_2$ to one another. The depths $z_1$ and $z_2$ have a direction facing each other in the direction of the respectively different structure, capacitor structure 12 or compensation structure 46. Here, the diameter $D_1$ corresponds to the diameter $D_2$. In other words, with respect to depths $z_1$ and $z_2$ as well as distances $x_1$ and $x_2$, the capacitor structure 12 and the compensation structure 46 can be implemented symmetrically to a line of symmetry 47 that is centrally arranged between the first and second main surface area.

Further, the compensation structure 46 comprises a compensation material 48 which is electrically conductive and implemented to conduct an electric voltage applied to the electrically conductive layer 44 covering the compensation structure 46 and the compensation material 48 via a third electrode terminal 26c. The compensation layer 52 is contacted at least partly by the compensation material. The compensation layer 52 is implemented to isolate the compensation material 48 from the substrate 60 and is an electrically insulating material. For example, the compensation layer 52 can comprise the same materials or can be formed of the same materials as the dielectric layer 18. By applying an electric voltage between the second electrode terminal 26b and the third electrode terminal 26b, an electric capacitor can be used. Thus, the integrated capacitor 30 can be used as a series connection of two capacitors in the depth direction z (vertical direction) between the first electrode terminal 26a and the third electrode terminal 26c, wherein the series connection comprises a center tap in the form of the second electrode terminal 26b. In other words, a first capacitor can be used between the first electrode terminal 26a and the second electrode terminal 26b, and a second capacitor between the second electrode terminal 26b and the third electrode terminal 26c. This can also be referred to as vertical structure of two capacitors. A series connection of two capacitors in the form of a two-sided capacitor structure can result in a further increase of the dielectric strength of the overall structure. Alternatively, the third electrode terminal can be arranged at the compensation material 48.

Alternatively, the second electrode terminal 26b can be short-circuited to the third electrode terminal 26c or connected to the same via an ohmic resistance. A short circuit between the second and third electrode terminals 26b and 26c allows deactivation of a possible capacitor, such that selective usage of the compensation structure 52 for mechanical optimization of the integrated capacitor 30 is enabled. Alternatively or additionally, the short circuit can also be implemented as local electric bypass of the compensation layer in the second main surface area, for example by direct contact or an electrically conductive material. This can result in a short circuit of a possibly parasitic capacitor in the compensation structure.

Here, the compensation material 48 can comprise the same materials or can be formed of the same materials as the capacitor material 22. The compensation structure 46 is equal to the capacitor structure 12 with respect to hole diameters $D_1$ and $D_2$ as well as hole distances $x_1$ and $x_2$. The compensation structure 46 is disposed offset with respect to the capacitor structure 12 by a distance $\Delta x$ in the x-direction. In other words, the compensation structure 46 is topographically equal to the capacitor structure 12 and is offset to the same.

It is an advantage of this embodiment that a density of functions or members of the integrated capacitor 30 can be increased further. In a first step, an integrated capacitor as shown, for example in FIG. 1, can be used instead of a ceramic or film capacitor. In a second step, two integrated capacitors can be realized in one member, i.e. in an integrated capacitor as shown in FIG. 3. This allows reduction of necessitated installation spaces. A reduced member size can result in increased member reliability, since the integrated capacitor presents a smaller target for mechanical deformations and/or damages.

An integrated realization of several capacitors can result in a reduced number of bond and/or solder connections resulting in an increased reliability of the circuits by a reduced number of possible flaws in the bond and/or solder connections as well as in a simplified design and connection technology (AVT), which allow less expensive and more reliable circuit realization.

In other words, the capacitor structure 12 and the compensation structure 46 are arranged at the substrate 16 opposing each other and are uniformly implemented within a tolerance range. The tolerance range can correspond to the distance $\Delta x$. Alternatively or additionally, the tolerance range can include differing depths $z_1$ and $z_2$, differing diameters $D_1$ and $D_2$, differing distances $x_1$ and $x_2$, alternatively or additionally differing distances in y-direction, or a differing geometry of the compensation structure with respect to the capacitor structure 12.

In other words, the compensation structure can comprise an electric function, i.e. a capacitive effect, and can serve to increase the capacitance, i.e. the integration density or operation voltage.

The 3D structures on the rear of the slice can be identical to the 3D structures on the front, but do not have to be. The layers on the rear of the slice, i.e. the compensation layers, can be identical to the layers on the front, i.e. the dielectric layer, but do not have to be.

If the dielectric layer 12 and/or the compensation layer 52 as well as the electrode material 22 and/or compensation material 48 have an interruption along the x-direction, two or more capacitors can also be realized in an integrated capacitor, i.e. in a device, in a lateral direction along the x-direction, which can be referred to as lateral structure of two or more capacitors beside one another. In such a lateral structure, the substrate 16 can be formed in multiple parts, and parts can, for example, be electrically insulated from one another.

In other words, FIG. 3 shows a monolithically integrated trench capacitor or RC snubber, i.e. a damping element, such a low pass with a two-sided slice processing for stress reduction for thick dielectric layers having an electric, i.e. capacitive, function of the structures on the rear. The integrated capacitor 30 can also be referred to as monolithic trench capacitor structured on both sides for power-electronic applications.

Figure 4:
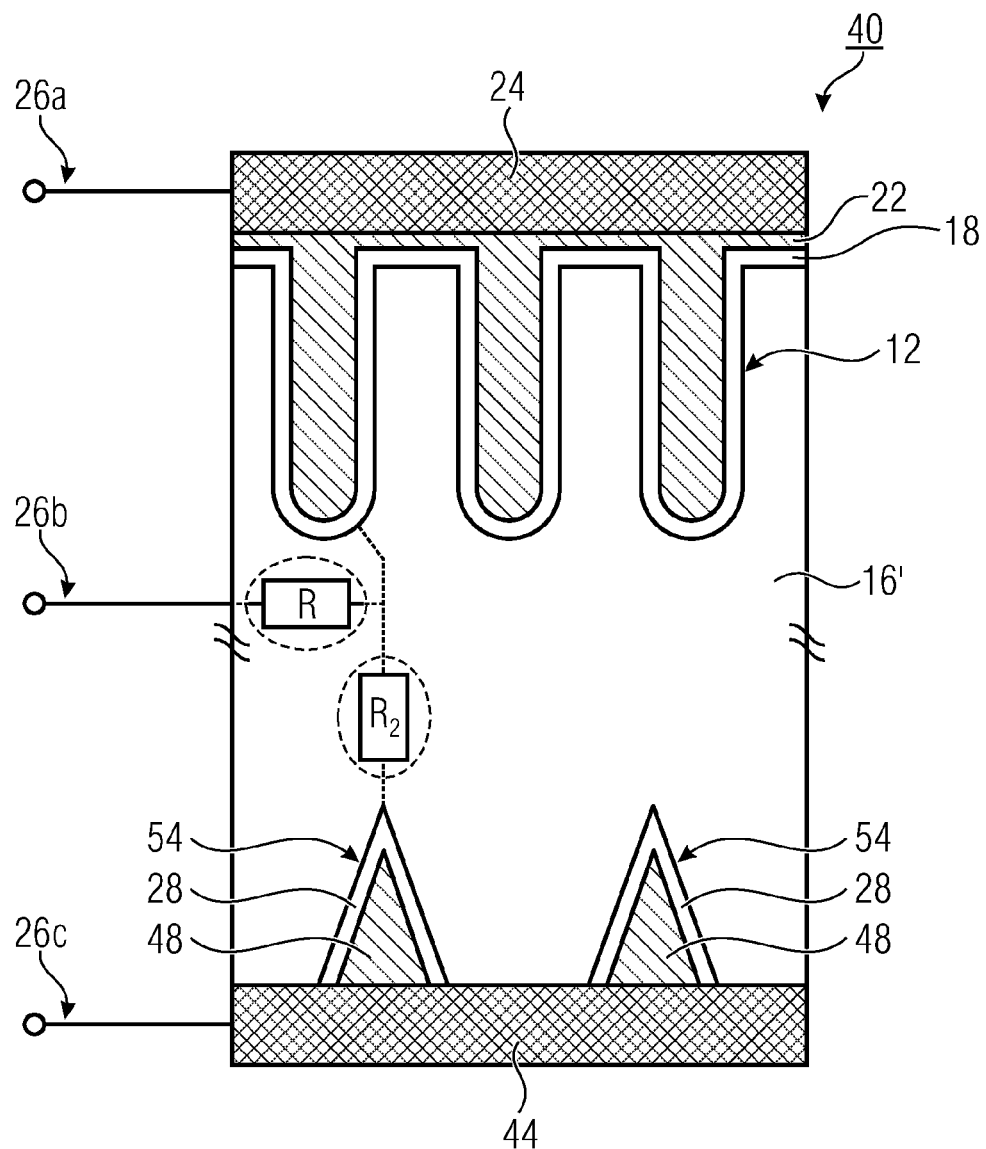
FIG. 4 is a schematic side view of a section of an integrated capacitor and a compensation structure having a V-shaped structure according to an embodiment of the present invention.

FIG. 4 shows a schematic side view of a section of an integrated capacitor 40 with the monolithic, i.e. integral substrate 16' and a capacitor structure 12 as illustrated in FIG. 1. A compensation structure 54 comprises a structure that is V-shaped in side view, as can be formed, for example, by elongated V-shaped trenches or pyramid shaped hole structures. In the trenches or holes of the compensation structure 54, the compensation material 48 is arranged. The capacitor structure 12 and the compensation structure 54 are integrated in the substrate 16'. The substrate 16' comprises a doping, such that the substrate 16' is both electrically conductive and comprises a resistance R in dependence of an amount of material and a material cross-section between two points, such as between the electrode terminals 26a and 26b per section between the two points. In other words, apart from the capacitance between the capacitor structure 12 and the electrically conductive material 24, the integrated capacitor 40 comprises an electric resistor which is determined at least partly by the doping in the substrate 16'. Further, based on the doping of the substrate 16', a resistance $R_2$ can be set between the third electrode terminal 26c and the second electrode terminal 26b, such that the integrated capacitor 40 can be used as a series connection of a resistor R or $R_2$ and a capacitor and possibly as RC snubber. A doping value between, for example, $5*10^{14}$ cm$^{-3}$ ($5*10\exp(14)*$cm$^\wedge$−3) and $5*10^{15}$ cm$^{-3}$ ($5*10\exp(15)*$cm$^\wedge$−3) allows, for example, for a silicon substrate 16' having a thickness of approximately 500 μm, depending on doping type and capacitor area, a resistance between approximately 0.5 to 50 ohm. Then, the resistivity can be approximately 0.25 to 25 ohm*cm.

Alternatively, doping of the substrate 16' can also be performed such that the substrate 16' has a high conductivity and hence low resistances R and $R_2$. For low resistances, such as when the integrated capacitor 40 is used as "pure" capacitor, doping can be in a range of approximately $1*10^{19}$ cm$^{-3}$ ($1*10\exp(19)*$cm$^\wedge$−3) such that the resistivity is in the order of 10 mOhm*cm.

Figure 5:
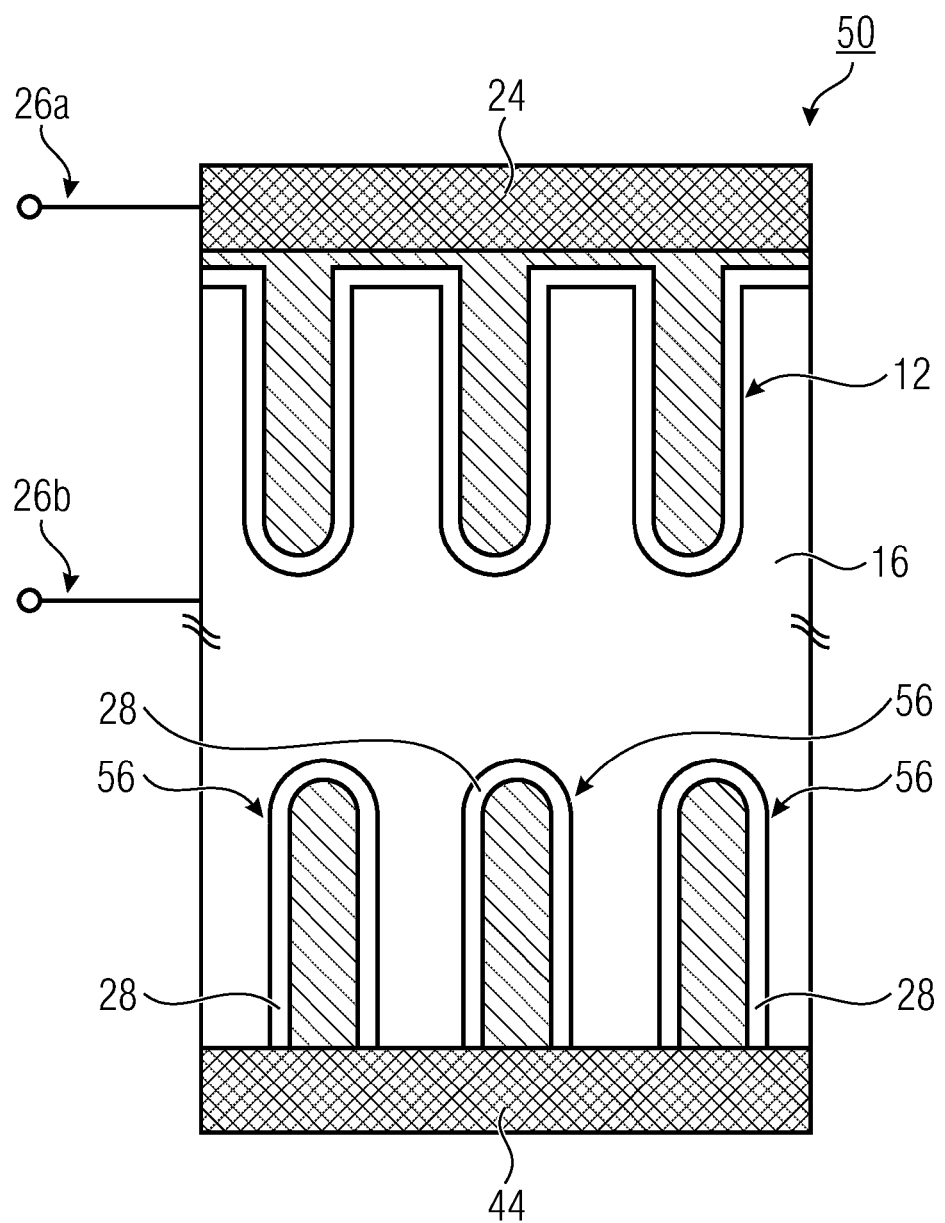
FIG. 5 is a schematic side view of a section of an integrated capacitor having a U-shaped compensation structure according to an embodiment of the present invention.

FIG. 5 shows a schematic side view of a section of an integrated capacitor 50 having a U-shaped compensation structure 56. The compensation structure 56 can be implemented, for example, as a hole structure or a trench structure having curved, i.e. round, oval or elliptic ends, i.e. transitions to the substrate 16. The surface enlargements by the compensation structure in the second main surface area relates to the surface portions where the compensation layer 28 is arranged.

Figure 6:
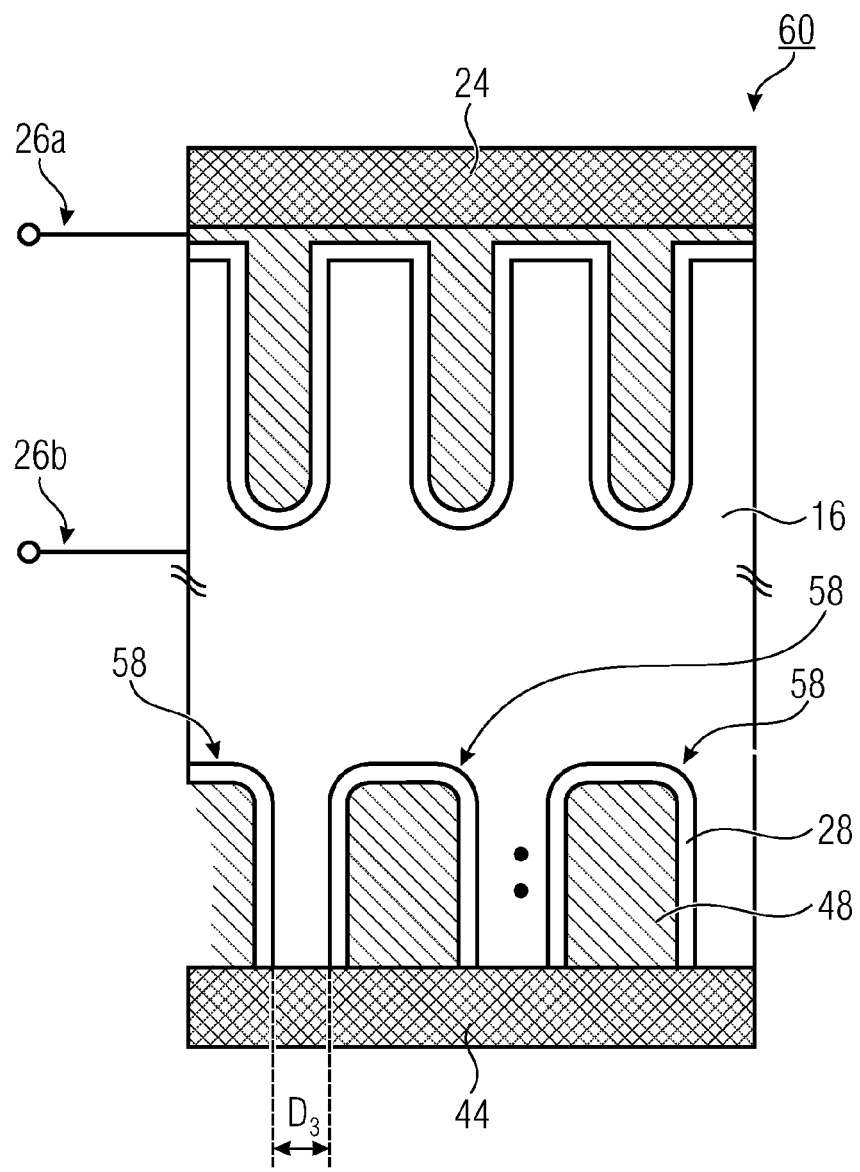
FIG. 6 is a schematic side view of a section of an integrated capacitor with a monolithic substrate and a compensation structure implemented as column structure according to an embodiment of the present invention.

FIG. 6 shows a schematic side view of a section of an integrated capacitor 16 with the monolithic substrate 16 and a compensation structure 58 comprising the compensation layer 28 where the compensation material 48 is arranged.

The compensation structure is implemented as column structure. In other words, some material, the column structures, remains, for example during an etching process for forming the compensation structure from the substrate 16. The first electrode terminal 26a is contacted by the electrode material.

This means that the substrate 16 is contacted by the electrically conductive layer 44 via column-like structures having a diameter $D_3$. In top view, areas with the compensation material 48 can be implemented, as one or several contiguous areas, where column structures of the substrate 16 are arranged, for example, in the form of a island, such that the "islands" of the substrate 16 with the diameter $D_3$ can be contacted by the electrically conductive layer 55. Alternatively, the dielectric layer can also completely space the substrate 16 apart from the electrically conductive layer 44, such that an electric capacitor can be used by means of the compensation structure 58. Alternatively or additionally, the compensation structure can be implemented as a ring structure, such that, for example, a hole structure having one or several holes is arranged within the "islands".

Figure 7:
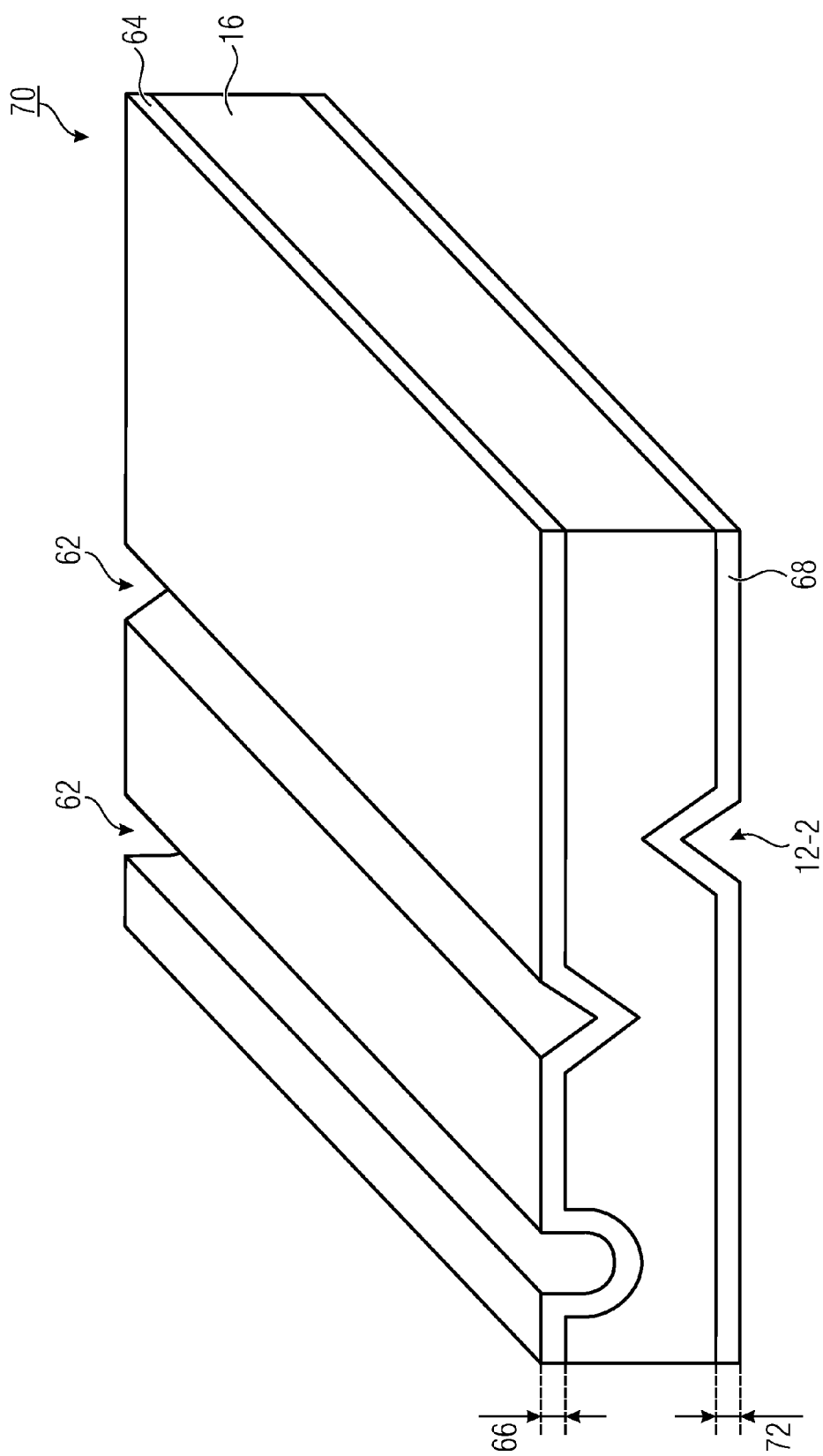
FIG. 7 is a schematic perspective view of parts of an integrated capacitor with a capacitor structure and a compensation structure implemented as trench structures according to an embodiment of the present invention.

FIG. 7 shows a schematic perspective view of parts of an integrated capacitor 70 having a capacitor structure 12-2 and a compensation structure 62. The capacitor structure 12-2 and the compensation structure 62 are implemented as trench structures, wherein the compensation structure 62 has both U-shaped and V-shaped trenches. The compensation structure 62 comprises a compensation layer 64 having a thickness, i.e. layer thickness 66. The capacitor structure 12-2 comprises a dielectric layer 68 having a thickness, i.e. layer thickness 72, wherein layer thicknesses 66 and 72 differ. For clarity reasons, an illustration of electrode material and electrically conductive layers is omitted in FIG. 7.

In other words, FIGS. 1, 3, 4, 5, 6 and 7 show monolithically integrated hole or trench capacitors or RC snubbers with two-sided slice processing for stress reduction for thick dielectric layers without electric or capacitive function of the rear structures.

The described integrated capacitors 10, 30, 40, 50, 60 or 70 can be used, for example, for absorbing electric energy from an energy storage, for example for implementing a coil (L) capacitor (C) resonant circuit for circuit relief, i.e. for receiving occurring spikes in a power circuit, for voltage limitation and/or for vibration damping in an electric network when the respective capacitor is used for contacting the electric network. Alternatively or additionally, the integrated capacitors can be used to receive electric energy from a source, such as an intermediate circuit capacitor in a voltage converter for voltage stabilization or voltage supply, such as an alternating current (AC)/direct current (DC), an AC-AC, a DC-DC or a DC-AC converter. In other words, such power modules can, for example, be used in inverters for power input, in drive inverters for drive control, in direct current converters for current transfer or in switching power supplies.

Further, due to the monolithic integration of such capacitors, advantages during design and production of power-electronic modules, such as for drive inverters and voltage converters are enabled, since the power semiconductor devices can also be realized as silicon chips and hence the same design and connection technology can be used for power-semiconductor elements and capacitors.

Alternatively or additionally, usage of one or several of the integrated capacitors as coupling capacitors or in a power module together with the power switches on a transfer substrate is conceivable, where the integrated capacitor is mounted on the transfer substrate with the power switches. Alternatively or additionally, it is also conceivable to implement one or several integrated capacitors on a LEAD frame together with one or several power semiconductor devices and to mount the same in a common package. In other words, the integrated capacitor can be mounted in a package together with a power switch. Alternatively, at least one integrated capacitor can be arranged with a semiconductor device in a common package or in a package of a packaged semiconductor device. During usage in a power module or in combination with the semiconductor device, the integrated capacitor/s can be used, for example as coupling capacitor or as damping element (RC snubber).

Further, implementation of two capacitors on or in the first main surface area and on or in the second main surface area allows reduction of production steps during wafer processing or the usage of merely one process step for processing the first and second main surface areas. Usage of the same process steps, for example for etching the compensation structures, for depositing the compensation layer, possibly for introducing the compensation material as well as coating with the electrically conductive material at the second main surface area can be performed simultaneously with respective processing of the first main surface area. This can have the effect that compared to current integrated capacitors, removal of the dielectric and/or the polysilicon on the rear, i.e. on the second main surface area, can be omitted, and hence the number of process steps can be reduced. A reduced number of production or process steps can result in a reduction of production and/or unit costs.

Figure 8:
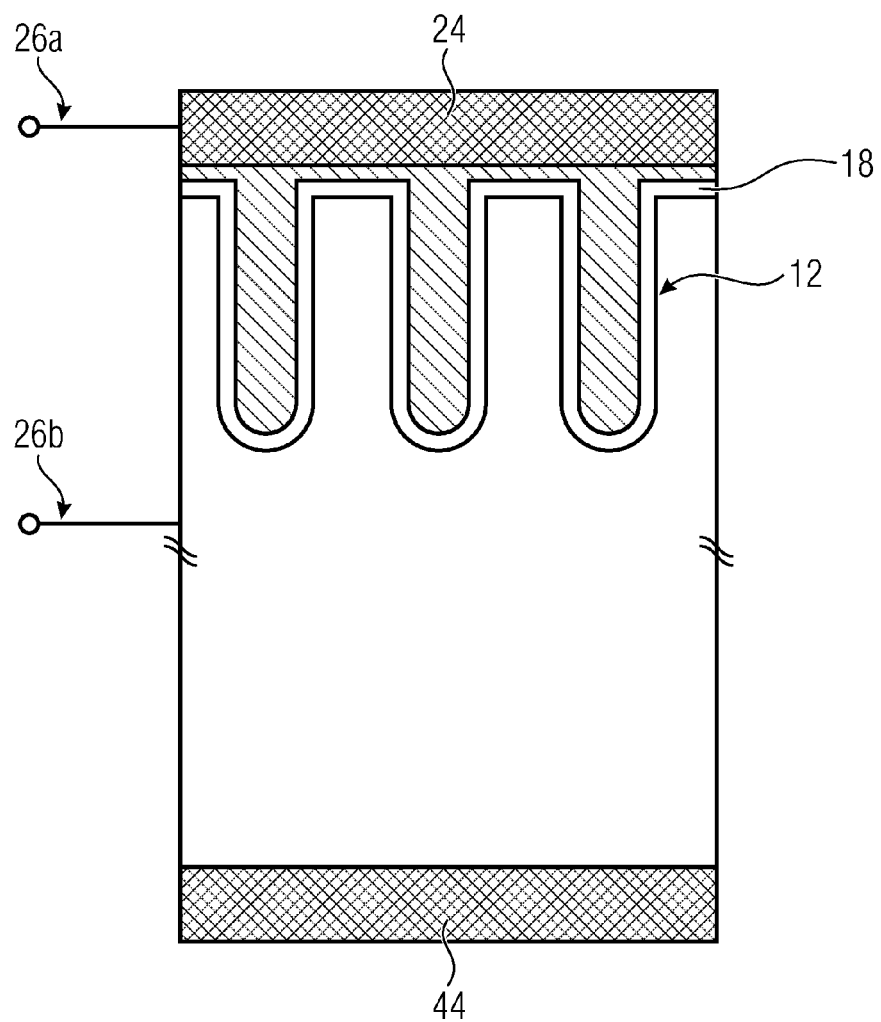
FIG. 8 is a schematic side view of a monolithically integrated trench capacitor or RC snubber with a structured front of the slice and a rear of the slice without compensation structure according to conventional technology.

FIG. 8 shows a schematic side view of a monolithically integrated trench capacitor or RC snubber having a structured front of the slice and a rear of the slice without structures, i.e. without compensation structure. In a surface enlargement by the capacitor structure 12 or a layer thickness of the dielectric layer 18, deformation in the processed wafer can occur during wafer processing, which prevents further processing of the wafer or induces breakage of the dielectric layer 18.

While some aspects have been described in the context of an apparatus, it is obvious that these aspects also represent a description of the respective method, such that a block or a device of an apparatus can also be seen a respective method step or as a feature of a method step. Analogously, aspects that have been described in the context of or as a method step also represent a description of a respective block or detail or feature of a respective apparatus.

A further embodiment includes a processing means, for example a computer or a programmable logic device that is configured or adapted to perform such a method.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LITERATURE

[1] J. vom Dorp, T. Erlbacher, A. J. Bauer, H. Ryssel, L. Frey, "Dielectric layers suitable for high voltage integrated trench capacitors", J. Vac. Sci. Technol. B 29(1), 01AB04, (2011)
[2] T. Erlbacher, H. Schwarzmann, A. J. Bauer, "Improving module performance and reliability in power electronic applications by monolithic integration of RC-snubbers", Proc. Internat. Symp. On Power Semicond. Dev. & ICs (ISPSD), Brügge, 283-286

[3] J. vom Dorp. T. Erlbacher, V. Lorentz, A. J. Bauer, H. Ryssel, L. Frey, "Integrierbare Bauelemente zur Erhöhung der Betriebssicherheit elektronischer Systemkomponenten im Automobil", Automotive meets Electronics 2010, Dortmund S. 72-77

[4] Hakim et al.; "Nonlinear capacitors integration", Proc. Internat. Semiconductor Conference 2000, Sinaia, S. 303-306 vol. 1

The invention claimed is:

1. An integrated high-voltage capacitor device structure, comprising:
    a substrate with a first main surface area and an opposing second main surface area;
    a first electrode terminal located at the first main surface area;
    a second electrode terminal located at the second main surface area;
    a capacitor structure with a dielectric layer, wherein the capacitor structure is integrated in the first main surface area; and
    a compensation structure with a compensation layer that is integrated in the second main surface area; wherein
    a ratio between a surface enlargement of the second main surface area effected by the compensation structure corresponds to at least 30% of the surface enlargement of the first main surface area effected by the capacitor structure;
    the first and second electrode terminals are arranged to receive an electric voltage;
    the capacitor structure comprises a first hole structure with a first plurality of holes, a first trench structure with a first plurality of trenches, a first column structure with a first plurality of columns, or a first ring structure;
    the compensation structure comprises a second hole structure with a second plurality of holes, a second trench structure with a second plurality of trenches, a second column structure with a second plurality of columns, or a ring structure; and
    a layer thickness of a first section of the compensation layer is not equal to a layer thickness of a second section of the compensation layer and the compensation structure is arranged congruently to the capacitor structure.

2. The integrated high-voltage capacitor device structure according to claim 1, wherein:
    a material tension is present between the dielectric layer and the substrate and a material tension is present between the compensation layer and the substrate; and
    the compensation structure is implemented to at least partly compensate, based on the material tension between the compensation layer and the substrate, the material tension between the dielectric layer and the substrate in the substrate, such that a deformation of the substrate induced by the mechanical tension between the dielectric layer and the substrate is reduced.

3. The integrated high-voltage capacitor device structure according to claim 1, wherein the surface enlargement of the first main surface area relates to an area of the capacitor structure covered by the dielectric layer, and wherein the surface enlargement of the second main surface area relates to an area of the compensation structure covered by the compensation layer.

4. An integrated high-voltage capacitor device structure comprising:
    a substrate with a first main surface area and an opposing second main surface area;
    a first electrode terminal located at the first main surface area;
    a second electrode terminal located at the second main surface area;
    a capacitor structure with a dielectric layer, wherein the capacitor structure is integrated in the first main surface area; and
    a compensation structure with a compensation layer, wherein the compensation structure is integrated in the second main surface area; wherein
    a material tension is present between the dielectric layer and the substrate and a material tension is present between the compensation layer and the substrate;
    the compensation structure is implemented to at least partly compensate, based on the material tension between the compensation layer and the substrate, the material tension between the dielectric layer and the substrate in the substrate, such that a deformation of the substrate induced by the mechanical tension between the dielectric layer and the substrate is reduced;
    the first and second electrode terminals are arranged to receive an electric voltage;
    the capacitor structure comprises a first hole structure with a first plurality of holes, a first trench structure with a first plurality of trenches, a first column structure with a first plurality of columns, or a first ring structure;
    the compensation structure comprises a second hole structure with a second plurality of holes, a second trench structure with a second plurality of trenches, a second column structure with a second plurality of columns, or a ring structure; and
    a layer thickness of a first section of the compensation layer is not equal to a layer thickness of a second section of the compensation layer and the compensation structure is arranged congruently to the capacitor structure.

5. The integrated high-voltage capacitor device structure according to claim 4, wherein a ratio between a surface enlargement of the second main surface area effected by the compensation structure corresponds to at least 30% of the surface enlargement of the first main surface area effected by the capacitor structure.

6. The integrated high-voltage capacitor device structure according to claim 5, wherein the surface enlargement of the first main surface area relates to an area of the capacitor structure covered by the dielectric layer, and wherein the surface enlargement of the second main surface area relates to an area of the compensation structure covered by the compensation layer.

7. The integrated high-voltage capacitor device structure according to claim 1, wherein the dielectric layer comprises silicon nitride and comprises a thickness of more than 500 nm, or wherein the dielectric layer comprises an equivalent oxide thickness (EOT) of more than 280 nm.

8. The integrated high-voltage capacitor device structure according to claim 1, wherein the compensation structure comprises a compensation material, which is isolated from the substrate by means of the compensation layer.

9. The integrated high-voltage capacitor device structure according to claim 8, wherein the compensation material and an electrode material in the capacitor structure comprise the same materials, or wherein the dielectric layer and the compensation layer comprise the same materials.

10. The integrated high-voltage capacitor device structure according claim 1, wherein the first electrode terminal is arranged at the capacitor structure and a third electrode terminal is arranged at the substrate.

11. The integrated high-voltage capacitor device structure according to claim 10, wherein the second electrode terminal is arranged at the compensation structure.

12. The integrated high-voltage capacitor device structure according to claim 1, wherein the compensation structure is short-circuited to the substrate.

13. The integrated high-voltage capacitor device structure according to claim 1, wherein the capacitor structure in the first main surface area and the compensation structure in the second main surface area are arranged opposite to one another at the substrate and are implemented equally within a tolerance range.

14. An integrated high-voltage capacitor device structure, comprising:
    a substrate with a first main surface area and an opposing second main surface area;
    a first electrode terminal located at the first main surface area;
    a second electrode terminal located at the second main surface area;
    a capacitor structure with a dielectric layer, wherein the capacitor structure is integrated in the first main surface area; and
    a compensation structure with a compensation layer that is integrated in the second main surface area; wherein
    a ratio between a surface enlargement of the second main surface area effected by the compensation structure with regard to a surface of the substrate in the second main surface area when trenches or holes of the compensation structure are absent, corresponds to at least 30% of the surface enlargement of the first main surface area effected by the capacitor structure with regard to a surface of the substrate in the first main surface area when trenches or holes of the capacitor structure are absent;
    structures of the compensation structure are arranged laterally offset with respect to structures of the capacitor structure;
    the first and second electrode terminals are arranged to receive an electric voltage;
    the capacitor structure comprises a first hole structure with a first plurality of holes, a first trench structure with a first plurality of trenches, a first column structure with a first plurality of columns, or a first ring structure;
    the compensation structure comprises a second hole structure with a second plurality of holes, a second trench structure with a second plurality of trenches, a second column structure with a second plurality of columns, or a ring structure; and
    a layer thickness of a first section of the compensation layer is not equal to a layer thickness of a second section of the compensation layer and the compensation structure is arranged congruently to the capacitor structure.

15. The integrated high-voltage capacitor device structure according to claim 14, wherein:
    a material tension is present between the dielectric layer and the substrate and a material tension is present between the compensation layer and the substrate; and
    the compensation structure is implemented to at least partly compensate, based on the material tension between the compensation layer and the substrate, the material tension between the dielectric layer and the substrate in the substrate, such that a deformation of the substrate induced by the material tension between the dielectric layer and the substrate is reduced.

16. The integrated high-voltage capacitor device structure according to claim 14, wherein the surface enlargement of the first main surface area relates to the surface of the substrate in the first main surface area when the trenches or holes of the capacitor structure are absent, and to an area of the capacitor structure covered by the dielectric layer, and wherein the surface enlargement of the second main surface area relates to the surface of the substrate in the second main surface area when the trenches or holes of the compensation structure are absent, and to an area of the compensation structure covered by the compensation layer.

17. An integrated high-voltage capacitor device structure comprising:
    a substrate with a first main surface area and an opposing second main surface area;
    a first electrode terminal located at the first main surface area;
    a second electrode terminal located at the second main surface area;
    a capacitor structure with a dielectric layer, wherein the capacitor structure is integrated in the first main surface area; and
    a compensation structure with a compensation layer, wherein the compensation structure is integrated in the second main surface area;
    a material tension is present between the dielectric layer and the substrate and a material tension is present between the compensation layer and the substrate;
    the compensation structure is implemented to at least partly compensate, based on the material tension between the compensation layer and the substrate, the material tension between the dielectric layer and the substrate in the substrate, such that a deformation of the substrate induced by the material tension between the dielectric layer and the substrate is reduced;
    structures of the compensation structure are arranged laterally offset with respect to structures of the capacitor structure;
    the first and second electrode terminals are arranged to receive an electric voltage;
    the capacitor structure comprises a first hole structure with a first plurality of holes, a first trench structure with a first plurality of trenches, a first column structure with a first plurality of columns, or a first ring structure;
    the compensation structure comprises a second hole structure with a second plurality of holes, a second trench structure with a second plurality of trenches, a second column structure with a second plurality of columns, or a ring structure; and
    a layer thickness of a first section of the compensation layer is not equal to a layer thickness of a second section of the compensation layer and the compensation structure is arranged congruently to the capacitor structure.

18. The integrated high-voltage capacitor device structure according to claim 17, wherein a ratio between a surface enlargement of the second main surface area effected by the compensation structure with regard to a surface of the substrate in a second main surface area when trenches or holes of the compensation structure are absent, corresponds to at least 30% of the surface enlargement of the first main surface area effected by the capacitor structure with regard to a surface of the substrate in the first main surface area when trenches or holes of the capacitor structure are absent.

19. The integrated high-voltage capacitor device structure according to claim 18, wherein the surface enlargement of the first main surface area relates to the surface of the substrate in the first main surface area when trenches or holes of the capacitor structure are absent, and to an area of the capacitor structure covered by the dielectric layer, and wherein the surface enlargement of the second main surface area relates to the surface of the substrate in the second main surface area when trenches or holes of the compensation structure are absent, and to an area of the compensation structure covered by the compensation layer.

20. The integrated high-voltage capacitor device structure according to claim 14, wherein the dielectric layer comprises silicon nitride and comprises a thickness of more than 500 nm, or wherein the dielectric layer comprises an equivalent oxide thickness (EOT) of more than 280 nm with regard to silicon dioxide.

21. Usage of the integrated high-voltage capacitor device structure according to claim 1 in a power module or in a packaged semiconductor device.

22. Usage of the integrated high-voltage capacitor device structure according to claim 21, wherein the same is implemented as damping element or coupling capacitor within the power module or the packaged semiconductor device.

23. Usage of the integrated high-voltage capacitor device structure according to claim 21, wherein the power module or the packaged semiconductor device with the integrated high-voltage capacitor device structure is connected to an energy source to absorb electric energy from the network.

24. Usage of the integrated high-voltage capacitor device structure according to claim 1, comprising a semiconductor device in a common package.

25. The integrated high-voltage capacitor device structure according to claim 1, wherein the integrated high-voltage capacitor device structure has an operating voltage of at least 600 V.

26. The integrated high-voltage capacitor device structure according to claim 1, wherein the integrated high-voltage capacitor is formed between the first and second electrode terminals.

27. The integrated high-voltage capacitor device structure according to claim 1, wherein the compensation structure does not include through silicon vias.

* * * * *